US012735783B2

(12) United States Patent
Kim et al.

(10) Patent No.: US 12,735,783 B2
(45) Date of Patent: Sep. 15, 2026

(54) MASK ASSEMBLY AND MASK ASSEMBLY MANUFACTURING METHOD

(71) Applicant: Samsung Display Co., Ltd., Yongin-si (KR)

(72) Inventors: Jeongkuk Kim, Yongin-si (KR); Hwi Kim, Yongin-si (KR); Youngmin Moon, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 461 days.

(21) Appl. No.: 18/450,563

(22) Filed: Aug. 16, 2023

(65) Prior Publication Data

US 2024/0124965 A1 Apr. 18, 2024

(30) Foreign Application Priority Data

Oct. 17, 2022 (KR) ........................ 10-2022-0132934

(51) Int. Cl.

| | |
|---|---|
| ***C23C 14/04*** | (2006.01) |
| ***C23C 16/04*** | (2006.01) |
| ***H10K 71/00*** | (2023.01) |
| ***H10K 71/16*** | (2023.01) |

(52) U.S. Cl.

CPC ............ *C23C 14/042* (2013.01); *C23C 14/04* (2013.01); *C23C 16/042* (2013.01); *H10K 71/00* (2023.02); *H10K 71/166* (2023.02); *H10K 71/621* (2023.02)

(58) Field of Classification Search

None

See application file for complete search history.

(56) References Cited

U.S. PATENT DOCUMENTS

| | | | |
|---|---|---|---|
| 2016/0310988 A1 | 10/2016 | Lee et al. | |
| 2022/0062945 A1 | 3/2022 | Kim et al. | |
| 2023/0265555 A1* | 8/2023 | Kim | C23C 16/042 |

FOREIGN PATENT DOCUMENTS

| | | | |
|---|---|---|---|
| KR | 20160127888 A | 11/2016 | |
| KR | 10-1869889 | 6/2018 | |
| KR | 10-2071487 | 1/2020 | |
| KR | 10-2186447 | 12/2020 | |
| KR | 20210064997 A | 6/2021 | |
| KR | 10-2357803 | 2/2022 | |
| KR | 10-2022-0027353 | 3/2022 | |
| KR | 102591352 * | 10/2023 | C23C 14/04 |

* cited by examiner

*Primary Examiner* — Jiong-Ping Lu

(74) *Attorney, Agent, or Firm* — CANTOR COLBURN LLP

(57) ABSTRACT

A mask assembly manufacturing method includes preparing a mask sheet and a frame, stretching and fixing the mask sheet to the frame, fixing a unit mask on the mask sheet, and forming an opening by removing an overlap portion of the mask sheet overlapping the unit mask after the fixing of the unit mask on the mask sheet.

12 Claims, 14 Drawing Sheets

MASK ASSEMBLY AND MASK ASSEMBLY MANUFACTURING METHOD

CROSS-REFERENCE TO RELATED APPLICATIONS

This U.S. non-provisional patent application claims priority to and benefits of Korean Patent Application No. 10-2022-0132934 under 35 U.S.C. § 119, filed in the Korean Intellectual Property Office (KIPO) on Oct. 17, 2022, the entire contents of which are incorporated herein by reference.

BACKGROUND

1. Technical Field

The disclosure herein relates to a mask assembly and a mask assembly manufacturing method, with which deposition accuracy is improved.

2. Description of the Related Art

A display may be manufactured through various processes. For example, in manufacturing a display, a deposition process may be used. In a deposition process for manufacturing a display, a fine metal mask (FMM), which is brought into close contact with a substrate to deposit an organic material, may be used. However, a mask is not limited thereto, and a cell unit mask may be used in a deposition process for manufacturing a display.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a mask assembly with improved deposition accuracy.

The disclosure also provides a mask assembly manufacturing method with improved deposition assembly.

The technical objectives to be achieved by the disclosure are not limited to those described herein, and other technical objectives that are not mentioned herein would be clearly understood by a person skilled in the art from the description of the disclosure.

An embodiment of the disclosure provides a mask assembly manufacturing method including preparing a mask sheet and a frame, stretching and fixing the mask sheet to the frame, fixing a unit mask on the mask sheet, and forming an opening by removing an overlap portion, of the mask sheet, overlapping the unit mask after the fixing of the unit mask on the mask sheet.

In an embodiment, the unit mask may include a cell region including a plurality of deposition openings, and a holding region adjacent to the cell region, and the opening of the mask sheet may overlap the cell region.

In an embodiment, the mask assembly manufacturing method may further include forming a preliminary opening in the mask sheet overlapping the cell region, and a size of the preliminary opening may be smaller than a size of the opening.

In an embodiment, the mask assembly manufacturing method may further include forming a groove by removing a portion of an upper surface of a first part of the mask sheet overlapping the cell region, and a depth of the groove may be smaller than a thickness of a second part of the mask sheet adjacent to the first part.

In an embodiment, the forming of the opening may include removing a portion of the mask sheet overlapping the groove.

In an embodiment, the mask assembly manufacturing method may further include forming a plurality of holes arranged apart from each other along an outer line of the overlap portion of the mask sheet, and the plurality of holes may each penetrate from an upper surface of the mask sheet toward a lower surface of the mask sheet.

In an embodiment, the mask assembly manufacturing method may further include forming a plurality of grooves arranged apart from each other along an outer line of the overlap portion of the mask sheet, and a depth of each of the plurality of grooves each may be smaller than a thickness of the mask sheet.

In an embodiment, the mask assembly manufacturing method may further include forming a groove along an outer line of the overlap portion of the mask sheet, and a depth of the groove may be smaller than a thickness of the mask sheet.

In an embodiment, on a plane, the groove may have a closed curve shape.

In an embodiment, the forming of the opening may include forming a plurality of openings by irradiating a lower surface of the mask sheet with laser.

In an embodiment, the forming of the plurality of openings may further include forming a first opening, and forming a second opening spaced apart from the first opening in a direction.

In an embodiment, the forming of the plurality of openings may further include forming a first opening on an edge of the mask sheet, and forming a second opening adjacent to a central portion of the mask sheet after the forming of the first opening.

In an embodiment of the disclosure, a mask assembly includes a frame including a frame opening, a mask sheet covering the frame opening, and including an opening, and a plurality of unit masks each including a cell region overlapping the opening, and a holding region adjacent to the cell region, and combined with the mask sheet by a plurality of welding points, and an inner surface, defining the opening, of the mask sheet includes at least one protrusion.

In an embodiment, the at least one protrusion may include a plurality of protrusions, and on a plane, the plurality of protrusions may be spaced apart from each other along the inner surface.

In an embodiment of the disclosure, a mask assembly includes a frame including a frame opening, a mask sheet covering the frame opening, and a plurality of unit masks including a cell region including a plurality of deposition openings, and a holding region adjacent to the cell region, and combined with the mask sheet by a plurality of welding points, and the mask sheet includes a first part completely covering at least a portion of the plurality of deposition openings, and a second part adjacent to the first part.

In an embodiment, a thickness of the first part of the mask sheet may be smaller than a thickness of the second part.

In an embodiment, the mask sheet may include a plurality of holes arranged along a boundary between the first part and the second part of the mask sheet, and a depth of each of the plurality of holes may be smaller than a thickness of the mask sheet.

In an embodiment, the mask sheet may include a recessed groove along a boundary between the first part and the second part of the mask sheet, and a depth of the groove may be smaller than a thickness of the mask sheet.

In an embodiment, the groove may be formed in an upper surface of the mask sheet combined with the plurality of unit masks.

In an embodiment, the mask sheet may include a plurality of preliminary openings in the first part of the mask sheet, and a size of each of the plurality of preliminary openings may be smaller than a size of the cell region.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
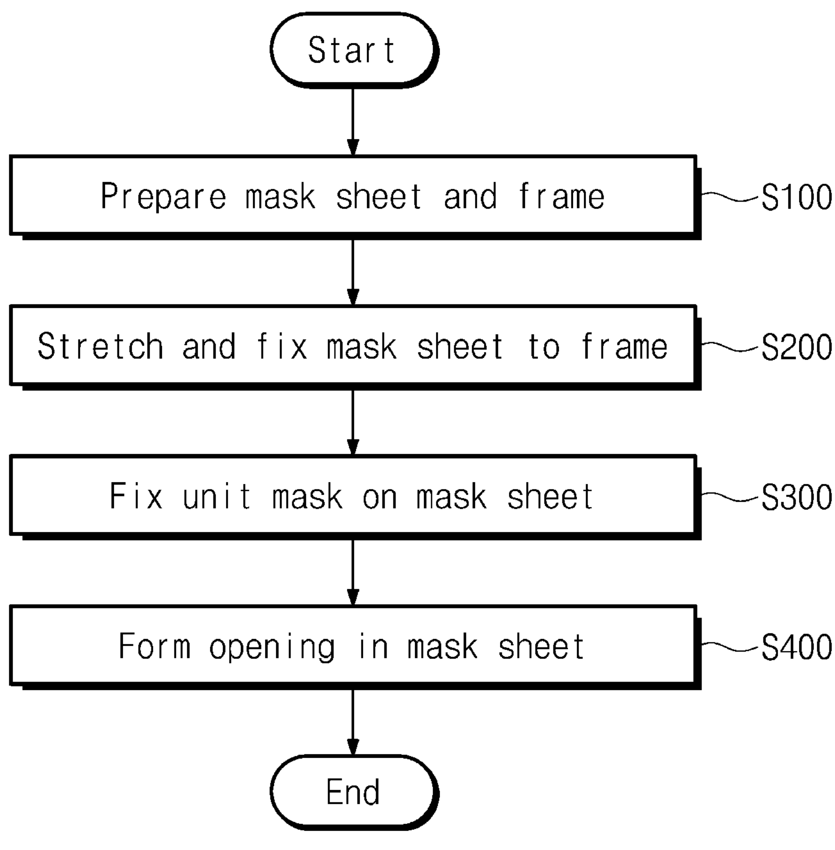
FIG. 1 is a schematic flowchart of a mask assembly manufacturing method according to an embodiment of the disclosure.

In this specification, when a component (or region, layer, portion, etc.) is referred to as "on", "connected", or "coupled" to another component, it means that it is placed/connected/coupled directly on the other component or a third component can be disposed between them.

The same reference numerals or characters refer to the same elements. In addition, in the drawings, thicknesses, ratios, and dimensions of components may be exaggerated for effective description of technical content.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Terms such as "first" and "second" may be used to describe various components, but the components should not be limited by the terms. These terms are only used for the purpose of distinguishing one component from other components. For example, without departing from the scope of the disclosure, a first component may be referred to as a second component, and similarly, a second component may be referred to as a first component. Singular expressions include plural expressions unless the context clearly indicates otherwise.

Terms such as "below", "lower", "above", and "upper" are used to describe the relationship between components shown in the drawings. The terms are relative concepts and are described based on the directions indicated in the drawings.

Terms such as "comprise," "include," or "have" are intended to designate the presence of a feature, number, step, action, component, part, or combination thereof described in the specification, and it should be understood that it does not preclude the possibility of presence or addition of one or more other features, numbers, steps, operations, components, parts, or combinations thereof.

Unless otherwise defined or implied herein, all terms (including technical and scientific terms) used in this specification have the same meaning as commonly understood by one of ordinary skill in the art to which this disclosure pertains. It will be further understood that terms, such as terms defined in commonly used dictionaries, should be interpreted as having a meaning consistent with the meaning having in the context of the related technology, and should not be interpreted as too ideal or excessively formal unless explicitly so defined herein.

Hereinafter, embodiments of the disclosure will be described with reference to the drawings.

FIG. 1 is a schematic flowchart of a mask assembly manufacturing method according to an embodiment of the disclosure.

Referring to FIG. 1, the mask assembly manufacturing method may be a method for manufacturing a display device process mask MK (hereinafter, a "mask assembly," see, e.g., FIG. 13) used in a deposition process among display device manufacturing processes using a mask assembly manufacturing apparatus. More specifically, the mask assembly MK, which is brought into close contact with a substrate for a deposition process, may be manufactured by the mask assembly manufacturing method.

The mask assembly manufacturing method may include an operation (S100) of preparing a mask sheet and a frame, an operation (S200) of stretching and fixing the mask sheet to the frame, an operation (S300) of fixing a unit mask on the mask sheet, and an operation (S400) of forming an opening in the mask sheet.

Figure 2:
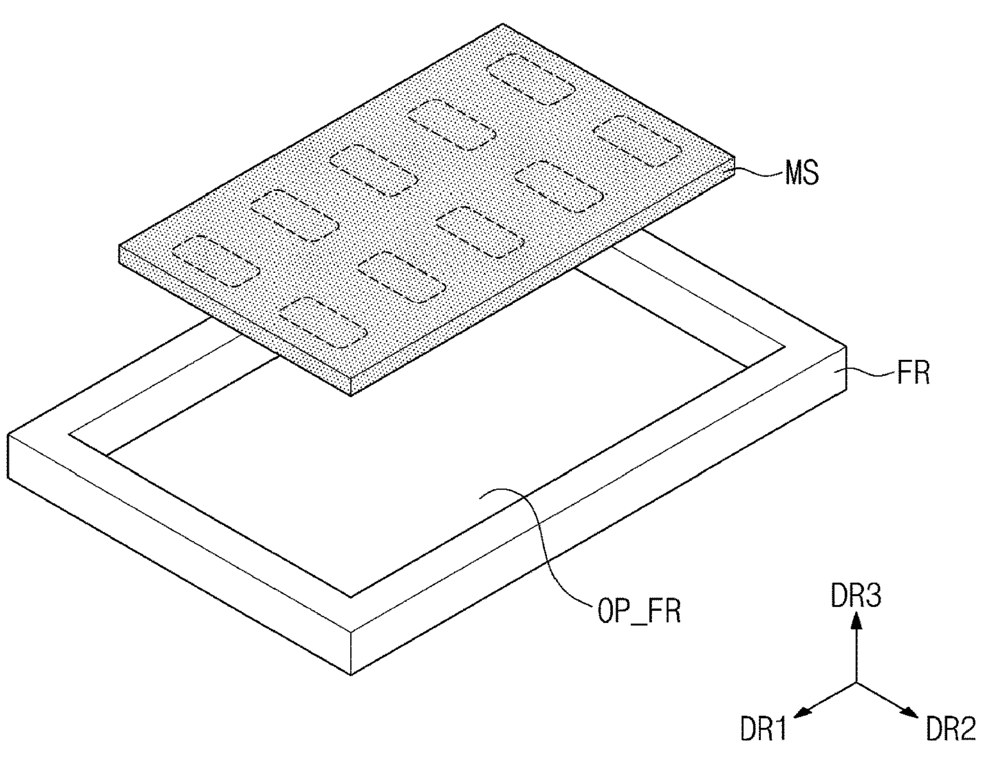
FIG. 2 is a schematic perspective view illustrating a part of a mask assembly manufacturing method according to an embodiment of the disclosure.

FIG. 2 is a schematic perspective view illustrating a part of a mask assembly manufacturing method according to an embodiment of the disclosure.

Referring to FIGS. 1 and 2, a mask sheet MS and a frame FR may be prepared (S100). A frame opening OP_FR may be defined in the frame FR. The frame FR may include a rigid material. For example, the frame FR may include or be composed of SUS, invar, and/or the like.

The mask sheet MS may be prepared to overlap the frame opening OP_FR in a view or direction (e.g., in the third direction DR3). The mask sheet MS may include a rigid material. For example, the mask sheet MS may include or be composed of SUS, invar, and/or the like. The mask sheet MS according to an embodiment may be a mask sheet MS in which openings are not formed. For example, the mask sheet MS may have a plate form as a whole.

Lengths of the mask sheet MS in a first direction DR1 and in a second direction DR2 may be respectively smaller than lengths of the frame FR in the first direction DR1 and in the second direction DR2. The mask sheet MS and the frame FR may have a same thickness, but an embodiment of the disclosure is not limited thereto.

Figure 3:
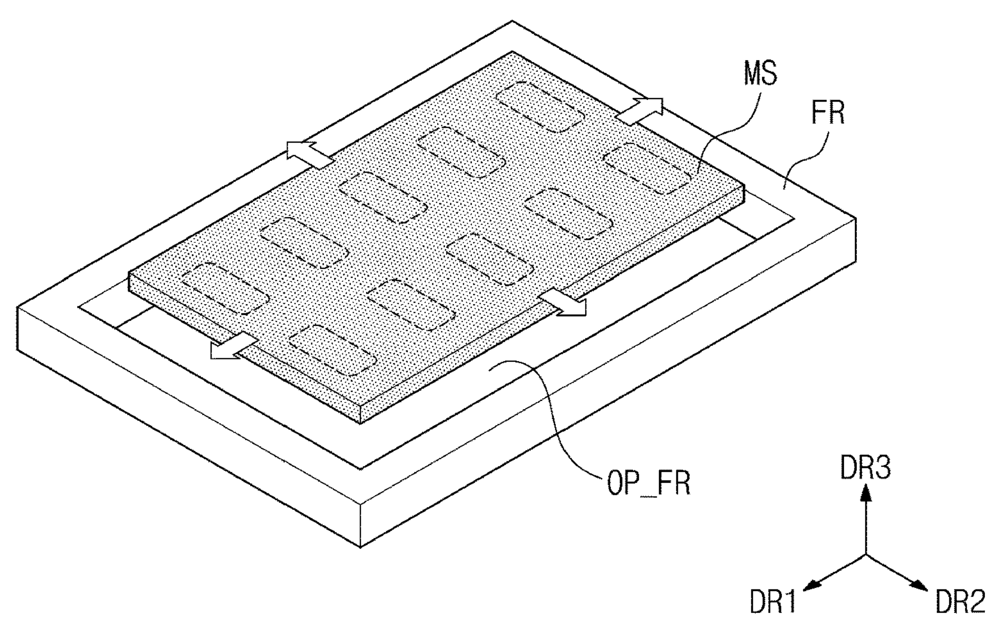
FIG. 3 is a schematic perspective view illustrating a part of a mask assembly manufacturing method according to an embodiment of the disclosure.

FIG. 3 is a schematic perspective view illustrating a part of the mask assembly manufacturing method according to an embodiment of the disclosure.

Referring to FIGS. 1 and 3, the mask sheet MS may be stretched and fixed to the frame FR (S200). The mask sheet MS may be stretched to cover the frame opening OP_FR. For example, the mask sheet MS may be stretched in the first direction DR1 according to a force acting thereon in the first direction DR1 and in the direction opposite to the first direction DR1, and may be stretched in the second direction DR2 according to a force acting thereon in the second direction DR2 and in the direction opposite to the second direction DR2. Accordingly, the mask sheet MS may be stretched to overlap the frame opening OP_FR, and the stretched mask sheet MS may be fixed onto the frame FR through welding.

Figure 4A:
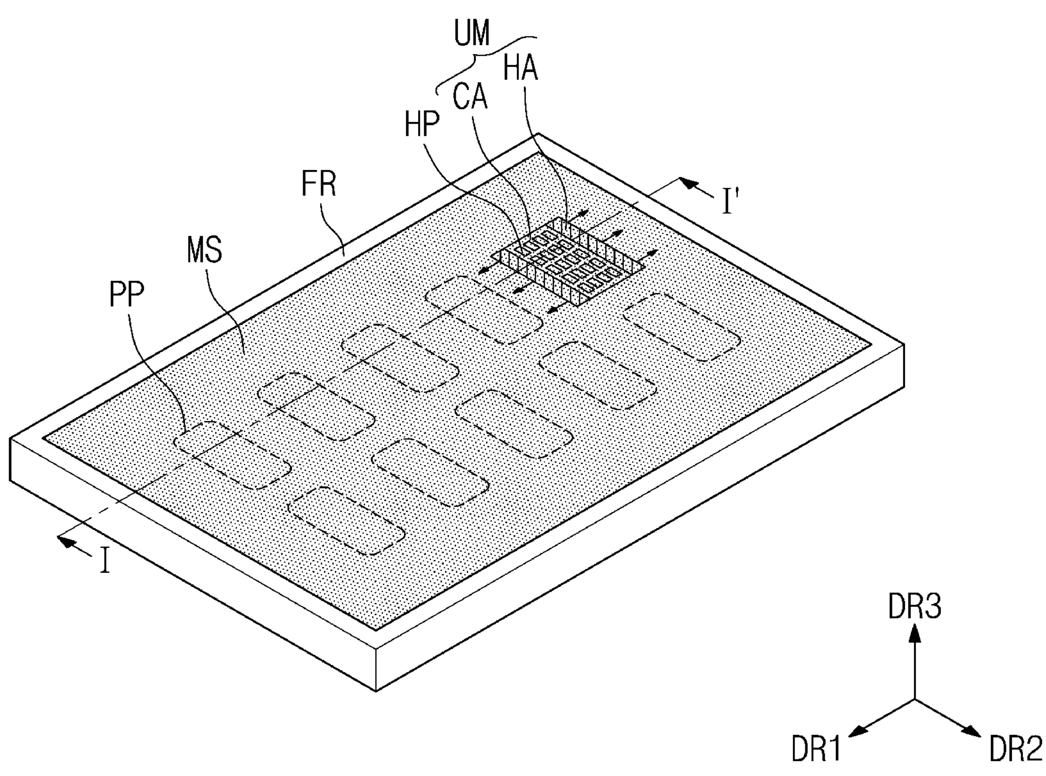
FIG. 4A is a schematic perspective view illustrating a part of a mask assembly manufacturing method according to an embodiment of the disclosure.
Figure 4B:
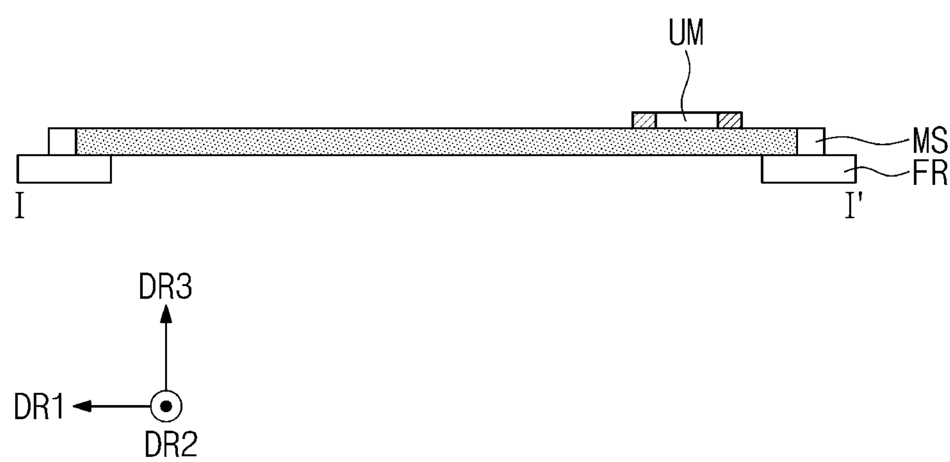
FIG. 4B is a schematic cross-sectional view taken along cutting line I-I' in FIG. 4A.

FIG. 4A is a schematic perspective view illustrating a part of the mask assembly manufacturing method according to an embodiment of the disclosure. FIG. 4B is a schematic cross-sectional view taken along cutting line I-I' in FIG. 4A.

Referring to FIGS. 1, 4A, and 4B, a unit mask UM may be fixed onto the mask sheet MS. The unit mask UM may include a cell region CA in which deposition openings HP are defined, and a holding region HA adjacent to the cell region CA. The cell region CA of the unit mask UM may be a region overlapping an opening OP (see, e.g., FIG. 5) to be formed in the mask sheet MS later.

A mask assembly manufacturing apparatus (not shown) may contact (or may be in contact with) the holding region HA of the unit mask UM to stretch the unit mask UM. For example, the mask assembly manufacturing apparatus (not shown) may adhere to the holding region HA of the unit mask UM by suctioning, and may stretch the unit mask UM in the first direction DR1. FIG. 4A illustrates the unit mask UM of which two sides are stretched in the first direction DR1. However, an embodiment of the disclosure is not limited thereto. For example, the four sides of the unit mask UM may be stretched in the first direction DR1 and in the second direction DR2. In another example, sides of the unit mask US may be stretched in various directions.

The stretched unit mask UM may be welded onto the mask sheet MS through a welding member (not shown) of the mask assembly manufacturing apparatus (not shown). For example, the welding member (not shown) may form welding points in the holding region HA by irradiating the holding region HA of the unit mask UM with laser, and the unit mask UM may be bonded onto the mask sheet MS by the welding points.

FIGS. 4A and 4B illustrate that a single unit mask UM is fixed, but multiple unit masks UM may be fixed to the mask sheet MS by repeating the operations illustrated in FIGS. 4A and 4B. For example, ten unit masks UM overlapping ten overlap portions PP of the mask sheet MS may be fixed, but the number of the unit masks UM to be fixed is not limited thereto. The number of the unit masks UM may be changed according to a size of a display device to be manufactured, or a size of the mask assembly MK (see FIG. 13) to be manufactured.

Figure 5:
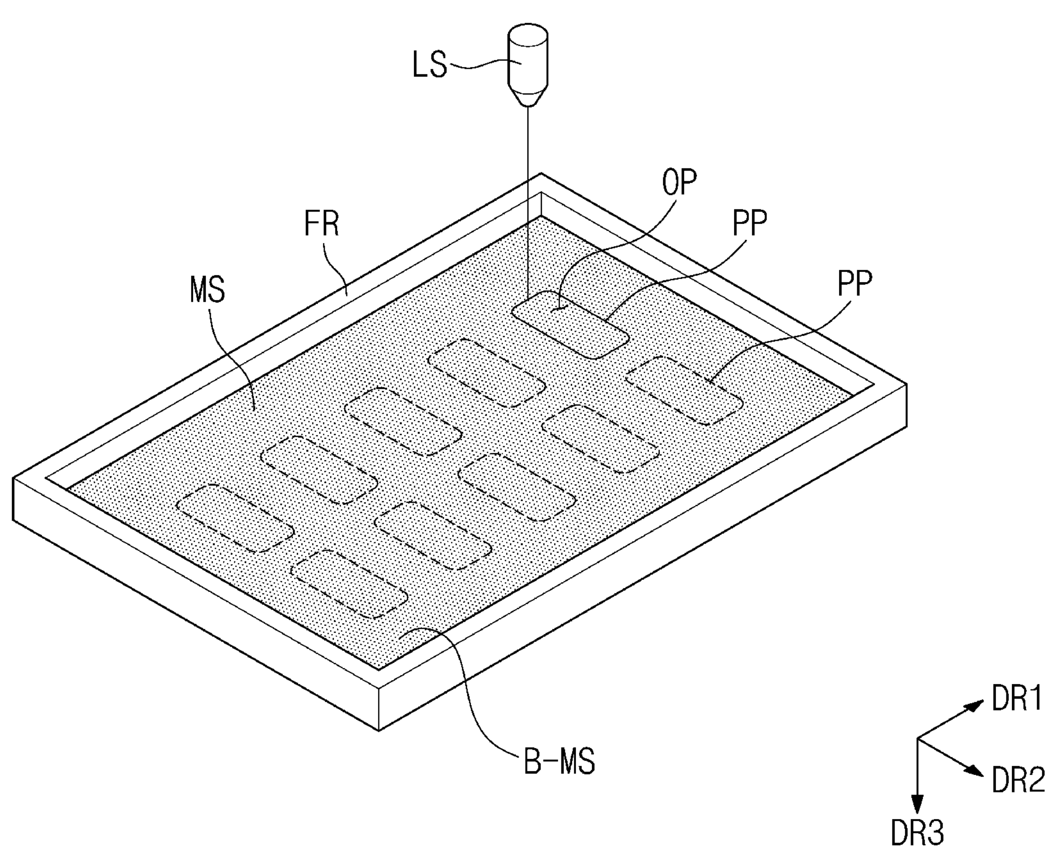
FIG. 5 is a schematic perspective view illustrating a part of a mask assembly manufacturing method according to an embodiment of the disclosure.

FIG. 5 is a schematic perspective view illustrating a part of the mask assembly manufacturing method according to an embodiment of the disclosure.

Referring to FIGS. 1 and 5, after the unit mask UM is fixed to the mask sheet MS (S300), the opening OP may be formed in the mask sheet MS (S400). For example, an overlap portion PP may be removed by irradiating the overlap portion PP of the mask sheet MS overlapping the unit mask UM with laser using a laser device LS, and the opening OP of the mask sheet MS may be formed. The laser device LS may irradiate a lower surface B-MS of the mask sheet MS with laser. The opening OP of the mask sheet MS formed through the above process may overlap the cell region CA of the unit mask UM.

FIG. 5 illustrates that an opening OP is formed, but an embodiment of the disclosure is not limited thereto. The operation (S400, see, e.g., FIG. 1) of forming an opening may further include an operation of forming multiple openings OP. For example, the laser device LS may irradiate the lower surface B-MS of the mask sheet MS with laser to form the openings OP.

According to an embodiment of the disclosure, after all the unit masks UM are coupled to (or connected to) the mask sheet MS in which the opening OP is not defined, the openings OP respectively overlapping the unit masks UM may be formed in the mask sheet MS. Since a deformation force generated by forming the opening OP in the mask sheet MS acts in a direction opposite to the direction of a deformation force generated by coupling the unit mask UM to the mask sheet MS, a deformation force generated in the entire mask sheet MS may be reduced. Accordingly, since the deformation force of the mask sheet MS decreases, stress generated by stretching may decrease, and pixel position accuracy (PPA) may be improved. The pixel position accuracy (PPA) may be referred to as deposition accuracy.

Figure 6A:
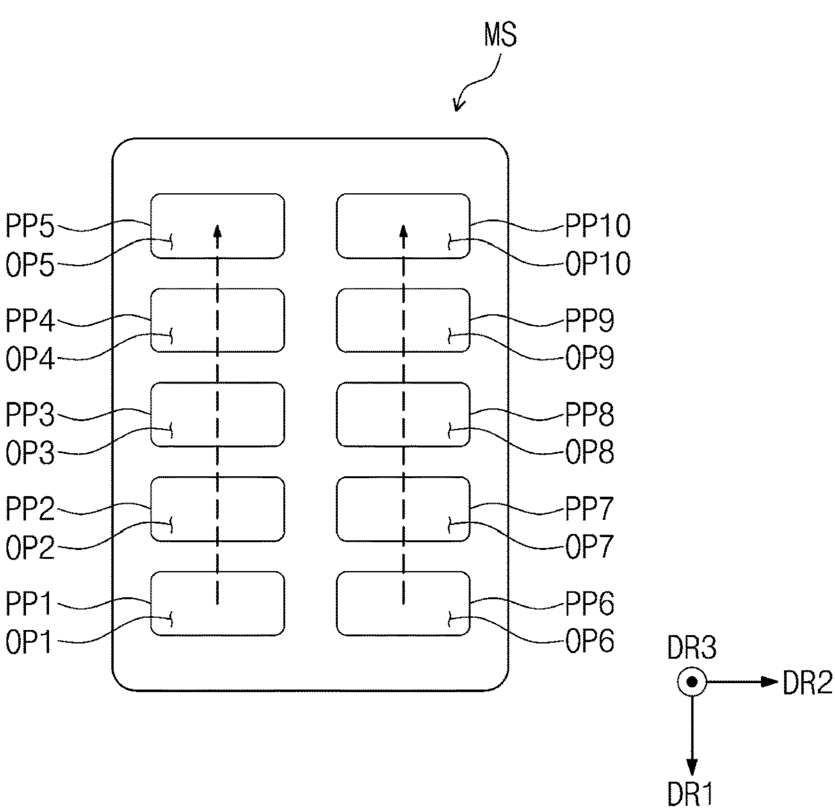
FIG. 6A is a schematic plan view of a mask sheet according to an embodiment of the disclosure.

FIG. 6A is a schematic plan view of the mask sheet MS according to an embodiment of the disclosure. FIG. 6A illustrates an order in which openings OP1, OP2, OP3, OP4, OP5, OP6, OP7, OP8, OP9, and OP10 of the mask sheet MS are formed.

Referring to FIG. 6A, an operation of forming the openings OP1, OP2, OP3, OP4, OP5, OP6, OP7, OP8, OP9, and OP10 may include an operation of forming a first opening OP1 and an operation of forming a second opening OP2. The second opening OP2 may be spaced apart from the first opening OP1 in the first direction DR1. For example, the first opening OP1 may correspond to a first overlap portion PP1, and the second opening OP2 may correspond to a second overlap portion PP2.

The openings OP1, OP2, OP3, OP4, OP5, OP6, OP7, OP8, OP9, and OP10 respectively corresponding to the first overlap portion PP1, the second overlap portion PP2, a third overlap portion PP3, a fourth overlap portion PP4, a fifth overlap portion PP5, a sixth overlap portion PP6, a seventh overlap portion PP7, an eighth overlap portion PP8, a ninth overlap portion PP9, and a tenth overlap portion PP10 may be sequentially formed in the mask sheet MS.

However, an order in which the openings OP1, OP2, OP3, OP4, OP5, OP6, OP7, OP8, OP9, and OP10 are formed is not limited thereto. For example, the openings OP6, OP7, OP8, OP9, OP10, OP1, OP2, OP3, OP4, and OP5 respectively corresponding to the sixth overlap portion PP6, the seventh overlap portion PP7, the eighth overlap portion PP8, the ninth overlap portion PP9, the tenth overlap portion PP10, the first overlap portion PP1, the second overlap portion PP2, the third overlap portion PP3, the fourth overlap portion PP4, and the fifth overlap portion PP5 may be sequentially formed.

According to an embodiment, in case that the openings OP1, OP2, OP3, OP4, OP5, OP6, OP7, OP8, OP9, and OP10 spaced apart from each other in the first direction DR1 are sequentially formed, since a movement distance of the laser device LS (see, e.g., FIG. 5) emitting laser decreases, a speed of a process for manufacturing the mask assembly MK (see, e.g., FIG. 13) may increase.

Figure 6B:
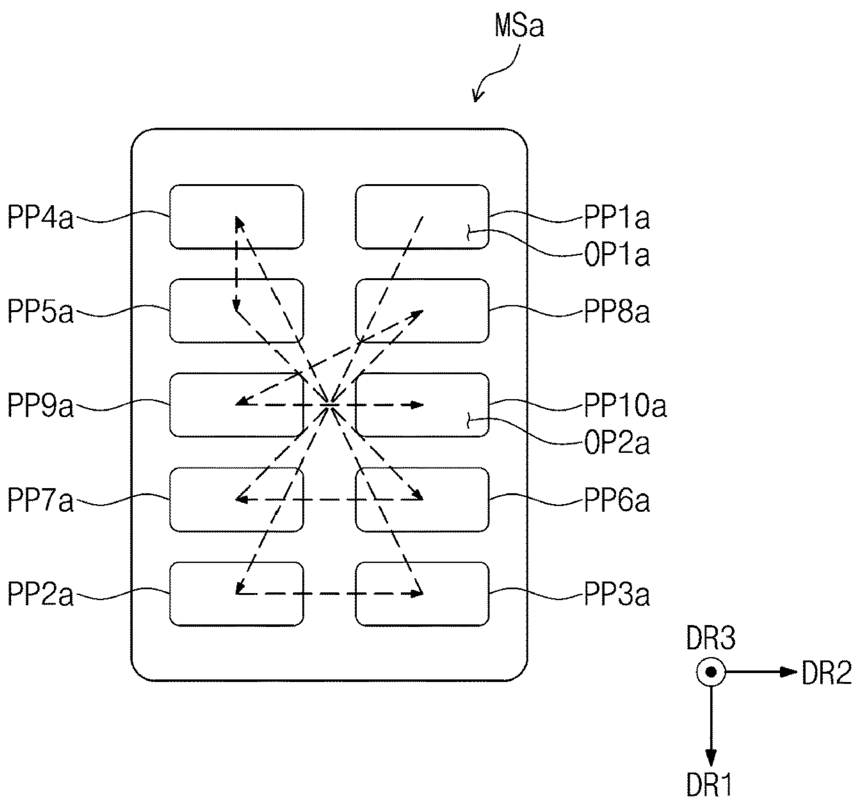
FIG. 6B is a schematic plan view of a mask sheet according to an embodiment of the disclosure.

FIG. 6B is a schematic plan view of a mask sheet MSa according to an embodiment of the disclosure. FIG. 6B illustrates an order in which openings OP1a and OP2a of the mask sheet MSa are formed.

Referring to FIG. 6B, the openings OP1a and OP2a may be formed in an order of starting from an opening close to (or adjacent to) an edge of the mask sheet MSa to an opening close to a central portion of the mask sheet MSa. The operation of forming the openings may include an operation of forming a first opening OP1a in an edge of the mask sheet MSa and an operation of forming a second opening OP2a close to the central portion of the mask sheet MSa. The second opening OP2a may be formed after forming the first opening OP1a. The first opening OP1a may correspond to a first overlap portion PP1a, and the second opening OP2a may correspond to a tenth overlap portion PP10a.

Openings respectively corresponding to the first overlap portion PP1a, a second overlap portion PP2a, a third overlap portion PP3a, a fourth overlap portion PP4a, a fifth overlap portion PP5a, a sixth overlap portion PP6a, a seventh overlap portion PP7a, an eighth overlap portion PP8a, a ninth overlap portion PP9a, and the tenth overlap portion PP10a may be sequentially formed in the mask sheet MSa. However, this is an example, and an order in which the openings are formed is not limited thereto. For example, the openings respectively corresponding to the fourth overlap portion PP4a, the third overlap portion PP3a, the second overlap portion PP2a, the first overlap portion PP1a, the eighth overlap portion PP8a, the seventh overlap portion PP7a, the sixth overlap portion PP6a, the fifth overlap portion PP5a, the tenth overlap portion PP10a, and the ninth overlap portion PP9a may be sequentially formed. Even in this case, openings close to the edge of the mask sheet MSa may be first formed, and then, openings close to the central portion of the mask sheet MSa may be formed.

According to the embodiment, adjacent openings may not be sequentially formed. In other words, the first opening OP1a defined in an outer region of the mask sheet MSa may be formed first, and thereafter the second opening OP2a adjacent to the central portion of the mask sheet MSa may be formed. Since openings OP1a and OP2a are symmetrically formed in the mask sheet MSa, a degree of deformation of the mask sheet MSa may be reduced.

According to an embodiment of the disclosure, since the openings OP1a and OP2a are formed after the unit mask UM is coupled to the mask sheet MSa, a degree of a change in the mask sheet MSa may be reduced. By controlling an order of forming the openings OP1a and OP2a, deviation of pixel position accuracy of the mask sheet MSa may be additionally corrected. Accordingly, the mask assembly MK (see FIG. 13) in which deformation of the mask sheet MSa is reduced may be manufactured.

Referring to FIGS. 6A and 6B, by controlling an order of forming openings, a deformation force acting on the mask sheet MS or MSa may be controlled, and pixel position accuracy (PPA) may also be controlled.

Figure 7:
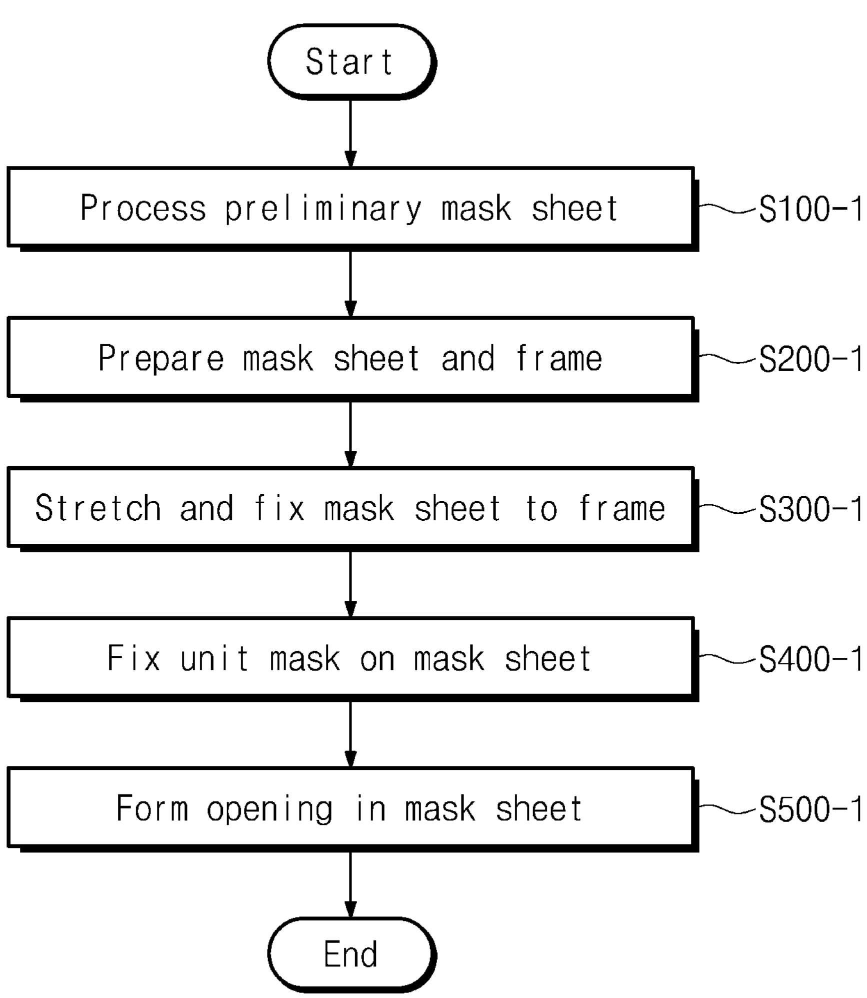
FIG. 7 is a schematic flowchart of a mask assembly manufacturing method according to an embodiment of the disclosure.

FIG. 7 is a schematic flowchart of a mask assembly manufacturing method according to an embodiment of the disclosure.

Referring to FIG. 7, the mask assembly manufacturing method may include an operation (S100-1) of processing a preliminary mask sheet, an operation (S200-1) of preparing a mask sheet and a frame, an operation (S300-1) of stretching and fixing the mask sheet to the frame SM, an operation (S400-1) of fixing a unit mask on the mask sheet, and an operation (S500-1) of forming an opening in the mask sheet.

The operation (S200-1) of preparing a mask sheet and a frame, the operation (S300-1) of stretching and fixing the mask sheet to the frame, the operation (S400-1) of fixing a unit mask on the mask sheet, and the operation (S500-1) of forming an opening in the mask sheet may be respectively substantially the same processes as the operation (S100, see, e.g., FIG. 1) of preparing a mask sheet and a frame, the operation (S200, see, e.g., FIG. 1) of stretching and fixing the mask sheet to the frame, the operation (S300, see, e.g., FIG. 1) of fixing a unit mask on the mask sheet, and the operation (S400, see, e.g., FIG. 1) of forming an opening in the mask sheet. For example, the mask assembly manufacturing method in FIG. 9 may further include the operation (S100-1) of processing a preliminary mask sheet in addition to the mask assembly manufacturing method in FIG. 1.

Figure 8A:
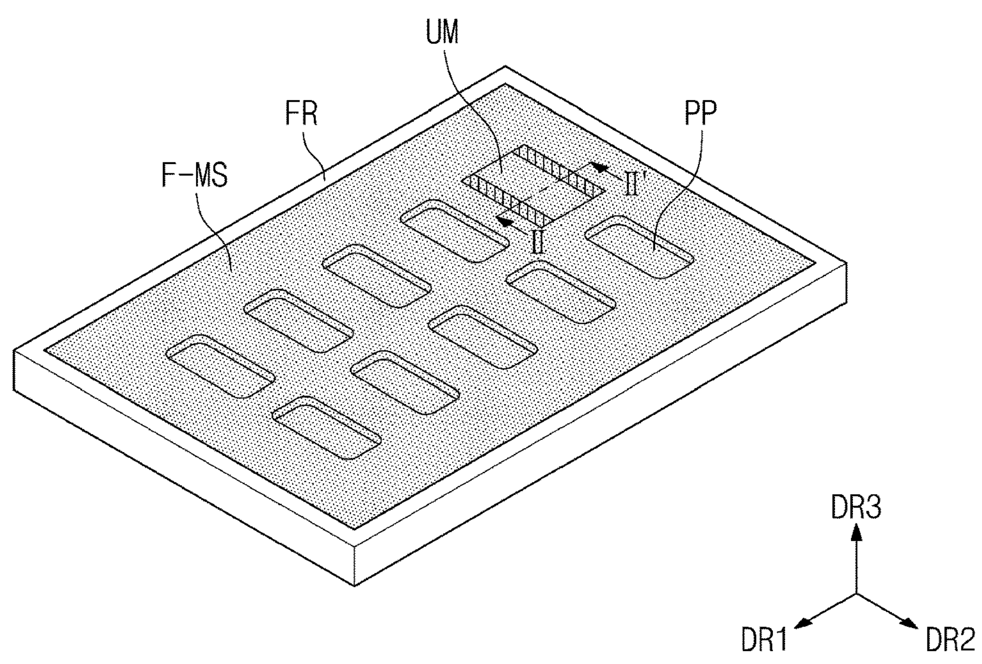
FIG. 8A is a schematic perspective view illustrating a part of a mask assembly manufacturing method according to an embodiment of the disclosure.
Figure 8B:
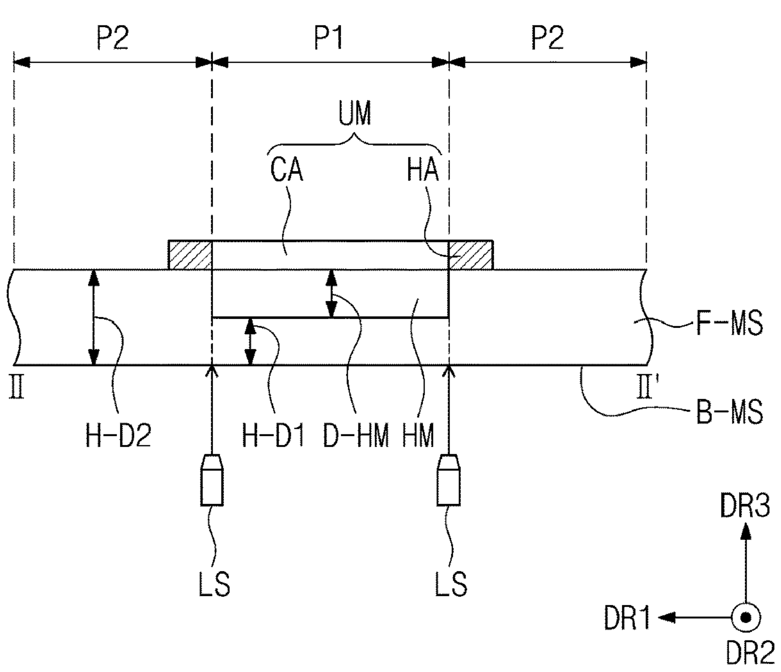
FIG. 8B is a schematic cross-sectional view taken along cutting line II-IT in FIG. 8A.

FIG. 8A is a schematic perspective view illustrating a part of the mask assembly manufacturing method according to an embodiment of the disclosure. FIG. 8B is a schematic cross-sectional view taken along cutting line II-IT in FIG. 8A. FIG. 8B illustrates the operation (S500-1, see, e.g., FIG. 7) of forming an opening in the mask sheet. FIG. 8A illustrates that a single unit mask UM is coupled to a mask sheet F-MS, but ten unit masks UM may be coupled to the mask sheet F-MS to correspond to ten overlap portions PP.

Referring to FIGS. 8A and 8B, the operation (S100-1, see, e.g., FIG. 7) of processing a preliminary mask sheet may correspond to an operation of forming a groove HM by removing a portion of an upper surface of a first part P1 of a preliminary mask sheet (not shown). In case that the preliminary mask sheet is processed, wet etching, laser, or mechanical punching may be used. For example, the groove HM may be formed by removing the portion of the upper surface through wet etching, laser, or mechanical punching. However, this is an example, and a method for processing the preliminary mask sheet is not limited thereto.

The first part P1 of the mask sheet F-MS in which the groove HM is formed may overlap the cell region CA of the unit mask UM. A thickness H-D1 of the first part P1 of the mask sheet F-MS may be smaller than a thickness H-D2 of a second part P2 thereof, and a depth D-HM of the groove HM of the mask sheet F-MS may be smaller than the thickness H-D2 of the second part P2 of the mask sheet F-MS adjacent to the first part P1.

Referring to FIG. 8B, the opening OP (see FIG. 5) formed in the mask sheet F-MS may be formed by removing a portion of the mask sheet F-MS overlapping the groove HM. For example, the laser device LS may form the opening OP by emitting laser toward the lower surface B-MS of the mask sheet F-MS overlapping the groove HM. The opening OP overlapping the cell region CA of the unit mask UM may be formed by emitting laser toward the edge of the groove HM.

According to an embodiment, since the opening OP of the mask sheet F-MS is formed after the unit mask UM is coupled to the mask sheet F-MS, a deformation force acting on the mask sheet F-MS may be smaller than in case that the unit mask UM is coupled to the mask sheet in which the opening OP is already formed. Accordingly, since the deformation force of the mask sheet F-MS becomes smaller, stress generated by stretching may be lower, and pixel position accuracy (PPA) may be further improved.

Since an operation of processing the mask sheet F-MS is performed first, damage to the unit mask UM may be reduced or removed. For example, since the first part P1 of the mask sheet F-MS may be spaced apart from the unit mask UM coupled onto the mask sheet F-MS, damage to the unit mask UM due to laser emitted toward the lower surface B-MS of the mask sheet F-MS may be reduced or removed.

Figure 9A:
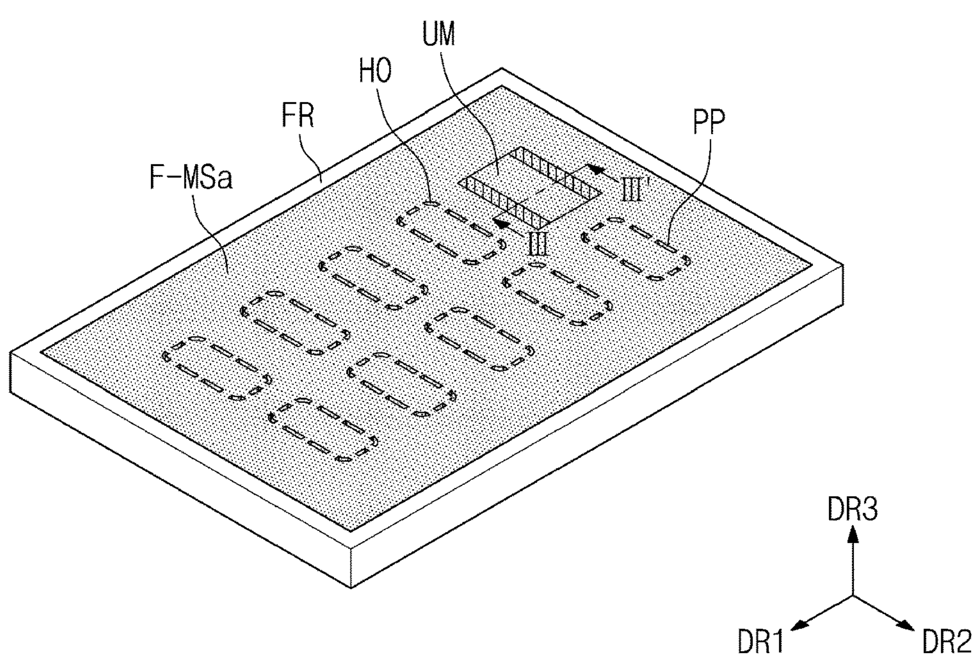
FIG. 9A is a schematic perspective view illustrating a part of a mask assembly manufacturing method according to an embodiment of the disclosure.
Figure 9B:
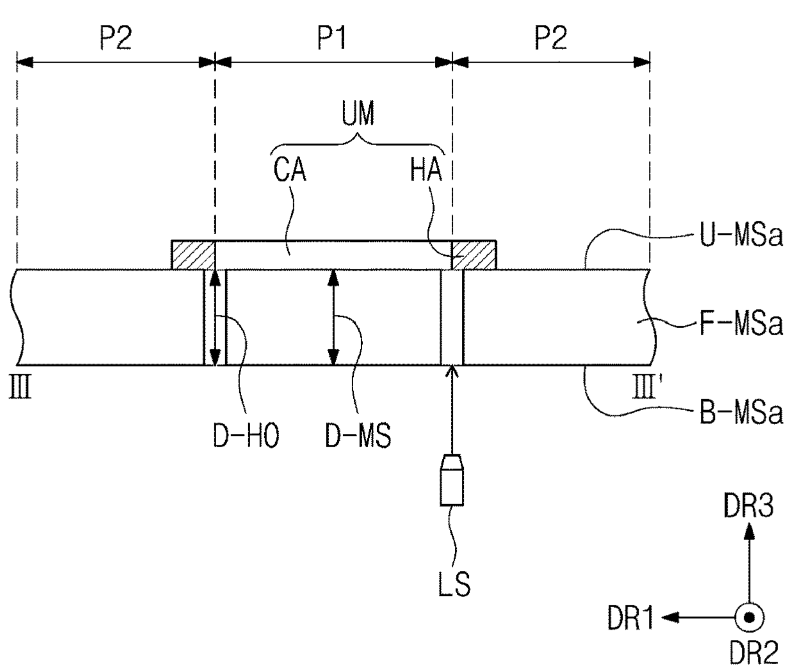
FIG. 9B is a schematic cross-sectional view taken along cutting line III-III' in FIG. 9A.

FIG. 9A is a schematic perspective view illustrating a part of the mask assembly manufacturing method according to an embodiment of the disclosure. FIG. 9B is a schematic cross-sectional view taken along cutting line III-III' in FIG. 9A. FIG. 9B illustrates the operation (S500-1, see, e.g., FIG. 7) of forming an opening in the mask sheet. FIG. 9A illustrates that a single unit mask UM is coupled to a mask sheet F-MSa, but ten unit masks UM may be coupled to the mask sheet F-MS a to correspond to ten overlap portions PP.

Referring to FIGS. 9A and 9B, the operation (S100-1) of processing a preliminary mask sheet may correspond to an operation of forming multiple holes HO arranged apart from each other along an outer line of the overlap portion PP of the preliminary mask sheet (not shown). For example, the holes HO arranged along the boundary between the first part P1 and the second part P2 of the mask sheet F-MSa may be defined. Each of the holes HO of the mask sheet F-MS a in which the holes HO are formed may penetrate the mask sheet F-MSa from an upper surface U-MSa of the mask sheet F-MSa to a lower surface B-MSa of the mask sheet F-MSa. A depth D-HO of each of the holes HO may be smaller than a thickness D-MS of the mask sheet F-MS a.

Referring to FIG. 9B, the opening OP (see, e.g., FIG. 5) formed in the mask sheet F-MSa may be formed by emitting laser toward the lower surface B-MSa of the mask sheet F-MSa to remove a portion of the mask sheet F-MS a. For example, the laser device LS may form the opening OP overlapping the cell region CA of the unit mask UM by emitting laser onto a region between the holes HO of the mask sheet F-MS a.

According to an embodiment, since the opening OP of the mask sheet F-MSa is formed after the unit mask UM is coupled to the mask sheet F-MS a, a deformation force acting on the mask sheet F-MSa may be smaller than in case that the unit mask UM is coupled to the mask sheet in which the opening OP is already formed. Accordingly, since the deformation force of the mask sheet F-MSa becomes smaller, stress generated by stretching may be lower, and pixel position accuracy (PPA) may be further improved. Since a processing operation of forming the holes HO in the mask sheet F-MSa is performed first, the opening OP may be readily formed.

Figure 10A:
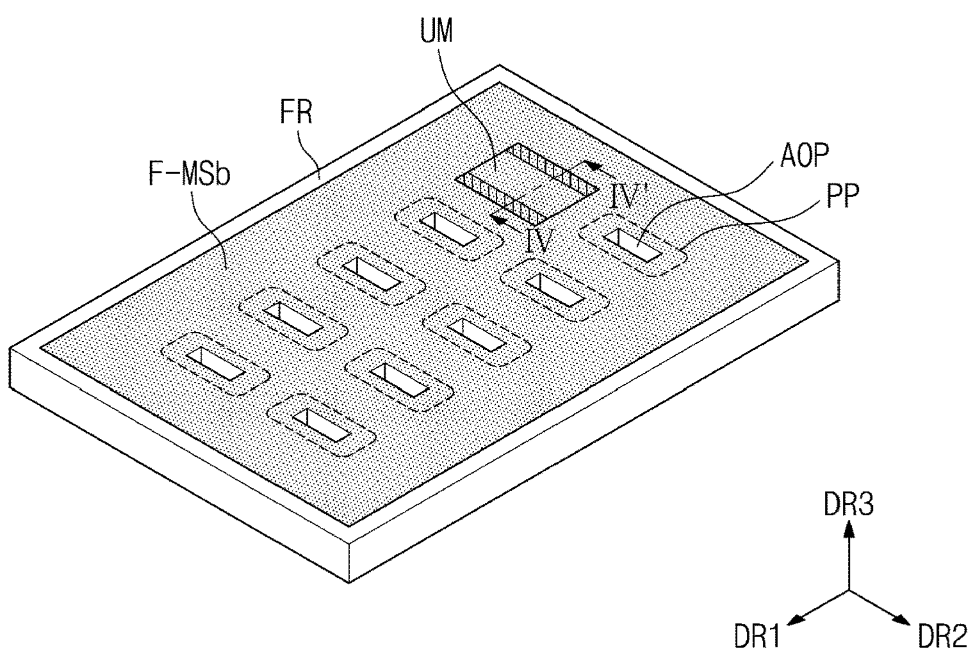
FIG. 10A is a schematic perspective view illustrating a part of a mask assembly manufacturing method according to an embodiment of the disclosure.
Figure 10B:
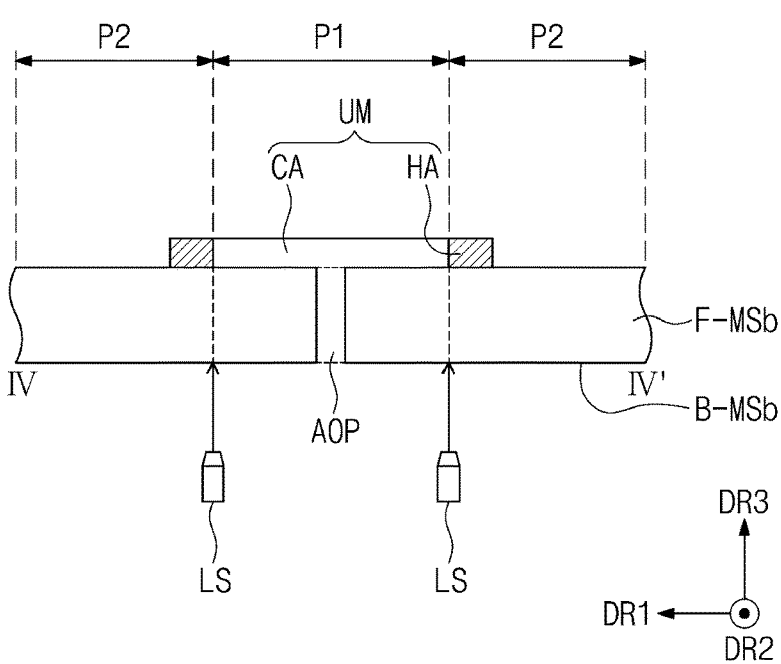
FIG. 10B is a schematic cross-sectional view taken along cutting line IV-IV' in FIG. 10A.

FIG. 10A is a schematic perspective view illustrating a part of the mask assembly manufacturing method according to an embodiment of the disclosure. FIG. 10B is a schematic cross-sectional view taken along cutting IV-IV' in FIG. 10A. FIG. 10B illustrates the operation (S500-1, see, e.g., FIG. 7) of forming an opening in the mask sheet. FIG. 10A illustrates that a single unit mask UM is coupled to a mask sheet F-MSb, but ten unit masks UM may be coupled to the mask sheet F-MSb to correspond to ten overlap portions PP.

Referring to FIGS. 10A and 10B, the operation (S100-1, see, e.g., FIG. 7) of processing a preliminary mask sheet may correspond to an operation of forming a preliminary opening AOP in the preliminary mask sheet. The preliminary opening AOP may overlap the cell region CA of the unit mask UM. Preliminary openings AOP may be defined in the first part P1 of the mask sheet F-MSb in which the preliminary opening AOP is formed, and a size of each of the preliminary openings AOP may be smaller than a size of the cell region CA. For example, the size of each of the preliminary openings AOP may be smaller than the size of the opening OP (see FIG. 5).

Referring to FIG. 10B, the opening OP formed in the mask sheet F-MSb may be formed by emitting laser toward a lower surface B-MSb of the mask sheet F-MSb to remove a portion of the mask sheet F-MSb. For example, the laser device LS may emit laser toward the lower surface B-MSb of the mask sheet F-MSb adjacent to the preliminary openings AOP, thereby forming the opening OP.

According to an embodiment, since the opening OP of the mask sheet F-MSb is formed after the unit mask UM is coupled to the mask sheet F-MSb, a deformation force acting on the mask sheet F-MSb may be smaller than in case that the unit mask UM is coupled to the mask sheet in which the opening OP is already formed. Accordingly, since the deformation force of the mask sheet F-MSb becomes smaller, stress generated by stretching may be lower, and pixel position accuracy (PPA) may be further improved. Since a processing operation of forming the preliminary openings AOP in the mask sheet F-MSb is performed first, the opening OP may be readily formed.

Figure 11A:
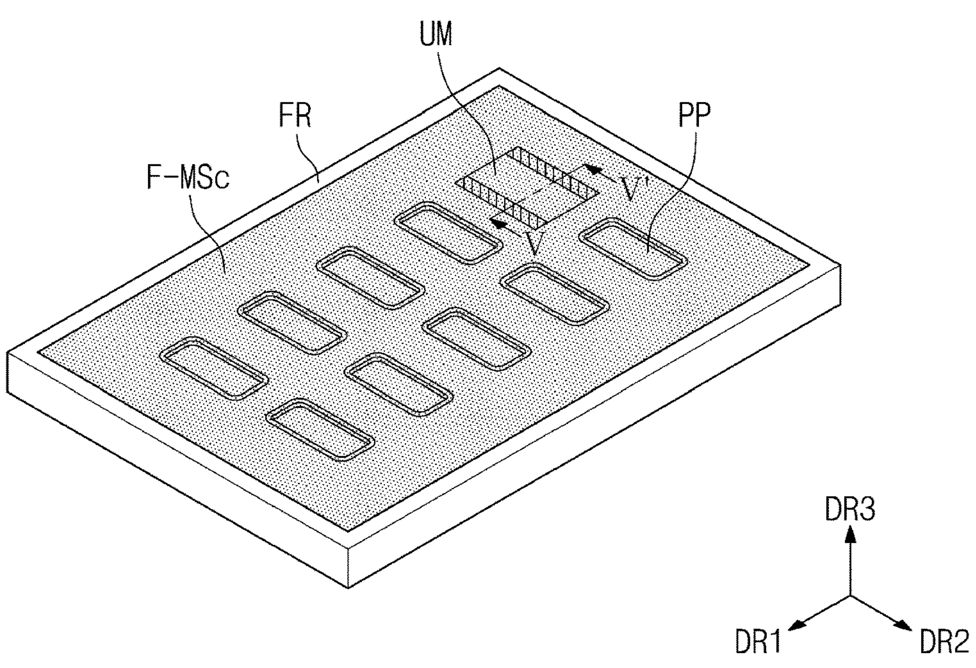
FIG. 11A is a schematic perspective view illustrating a part of a mask assembly manufacturing method according to an embodiment of the disclosure.
Figure 11B:
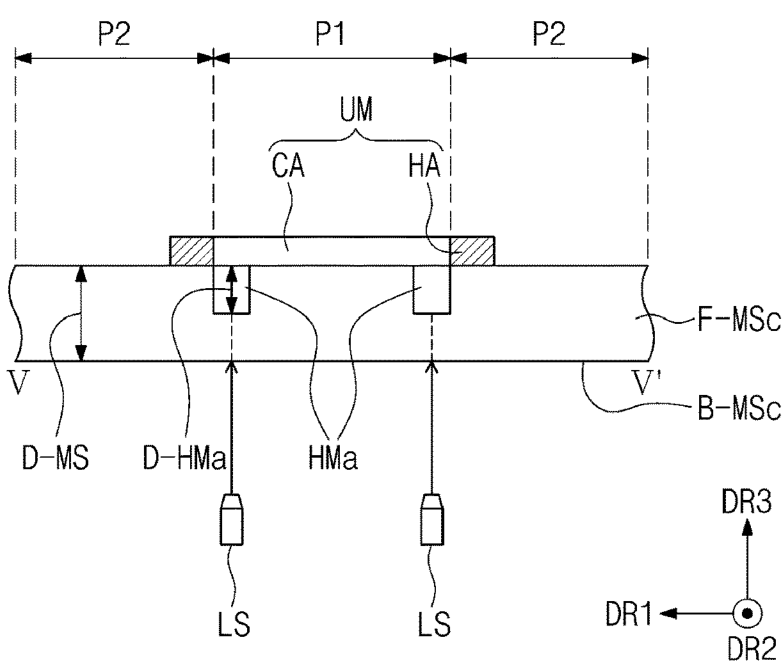
FIG. 11B is a schematic cross-sectional view taken along cutting line V-V' in FIG. 11A.

FIG. 11A is a schematic perspective view illustrating a part of the mask assembly manufacturing method according to an embodiment of the disclosure. FIG. 11B is a schematic cross-sectional view taken along cutting line V-V' in FIG. 11A. FIG. 11B illustrates the operation (S500-1, see, e.g., FIG. 7) of forming an opening in the mask sheet. FIG. 11A illustrates that a single unit mask UM is coupled to a mask sheet F-MSc, but the disclosure is not limited thereto. For example, ten unit masks UM may be coupled to the mask sheet F-MSc to correspond to ten overlap portions PP.

Referring to FIGS. 11A and 11B, the operation (S100-1) of processing a preliminary mask sheet may correspond to an operation of forming a groove HMa in the mask sheet F-MSc along an outer line of the overlap portion PP. A depth D-HMa of the groove HMa may be smaller than the thickness D-MS of the mask sheet F-MSc. The groove HMa may have a closed curve shape in a plan view. A recessed groove HMa may be defined along the boundary between the first part P1 and the second part P2 of the mask sheet F-MSc in which the groove HMa is formed.

Referring to FIG. 11B, the opening OP formed in the mask sheet F-MSc may be formed by removing a portion of the mask sheet F-MSc overlapping the groove HMa. For example, the laser device LS may emit laser toward a lower surface B-MSc of the mask sheet F-MSc overlapping the groove HMa, thereby forming the opening OP.

According to an embodiment, since the opening OP of the mask sheet F-MSc is formed after the unit mask UM is coupled to the mask sheet F-MSc, a deformation force acting on the mask sheet F-MSc may be smaller than in case that the unit mask UM is coupled to the mask sheet in which the opening OP is already formed. Accordingly, since the deformation force of the mask sheet F-MSc becomes smaller, stress generated by stretching may be lower, and pixel position accuracy (PPA) may be further improved.

Since an operation of processing the mask sheet F-MSc is performed first, damage to the unit mask UM may be reduced or removed. For example, since the first part P1 of the mask sheet F-MSc is spaced apart from the unit mask UM coupled onto the mask sheet F-MSc, damage to the unit mask UM due to laser emitted toward the lower surface B-MSc of the mask sheet F-MSc may be reduced or removed.

Figure 11C:
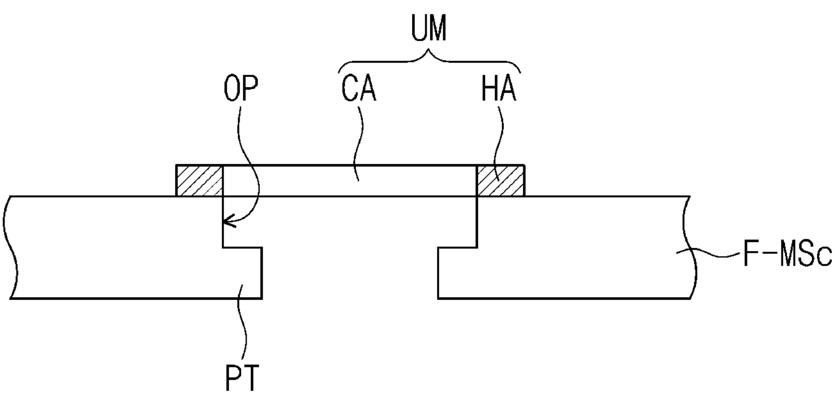
FIG. 11C is a schematic cross-sectional view illustrating a part of a mask assembly manufacturing method according to an embodiment of the disclosure.
Figure 11C:
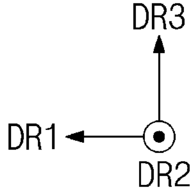

FIG. 11C is a schematic cross-sectional view illustrating a part of the mask assembly manufacturing method according to an embodiment of the disclosure. FIG. 11C illustrates a mask sheet F-MSc in which the opening OP is formed.

Referring to FIG. 11C, an inner surface, defining the opening OP, of the mask sheet F-MSc may include a protrusion PT. Since the cell region CA of the unit mask UM is coupled to overlap the recessed groove HMa (see FIG. 11B) formed by processing a preliminary mask sheet, and the opening OP is formed in a portion overlapping the cell region CA, the opening OP of the mask sheet F-MSc may include a protrusion PT shape.

Figure 12A:
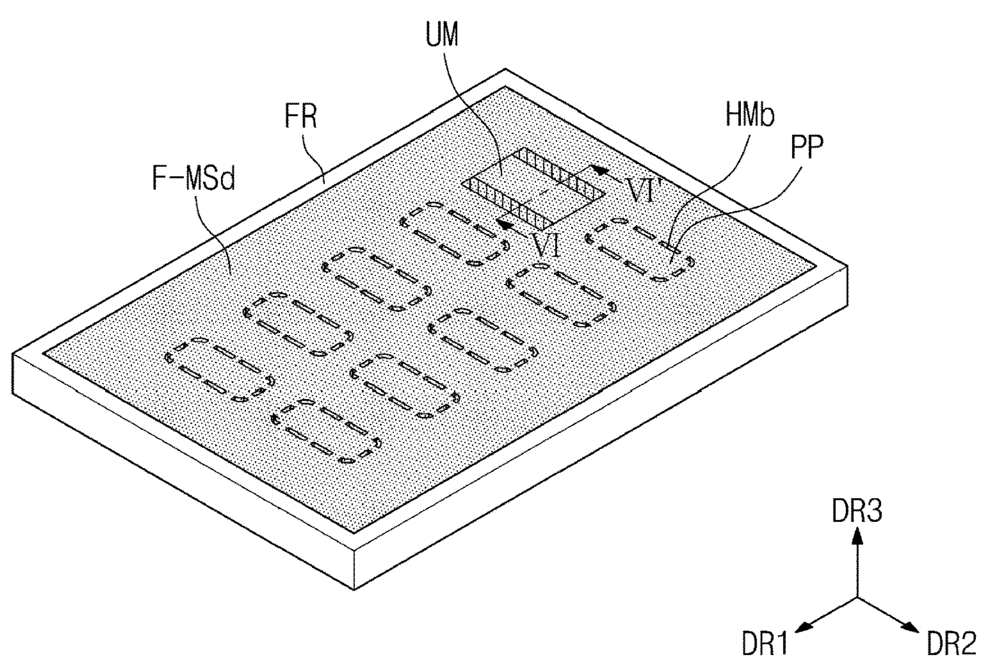
FIG. 12A is a schematic perspective view illustrating a part of a mask assembly manufacturing method according to an embodiment of the disclosure.
Figure 12B:
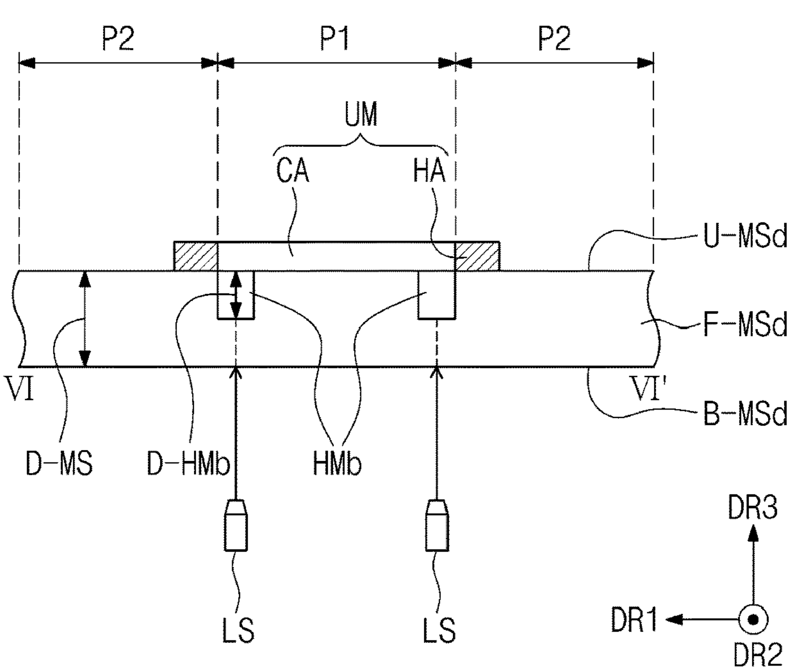
FIG. 12B is a schematic cross-sectional view taken along cutting line VI-VI' in FIG. 12A.

FIG. 12A is a schematic perspective view illustrating a part of the mask assembly manufacturing method according to an embodiment of the disclosure. FIG. 12B is a schematic cross-sectional view taken along cutting line VI-VI' in FIG. 12A. FIG. 12B illustrates the operation (S500-1, see, e.g., FIG. 7) of forming an opening in the mask sheet. FIG. 12A illustrates that a single unit mask UM is coupled to a mask sheet F-MSd, but the disclosure is not limited thereto. For example, ten unit masks UM may be coupled to the mask sheet F-MSd to correspond to ten overlap portions PP.

Referring to FIGS. 12A and 12B, the operation (S100-1, see, e.g., FIG. 7) of processing a preliminary mask sheet may correspond to an operation of forming grooves HMb arranged apart from each other along an outer line of the overlap portion PP in the preliminary mask sheet (not shown). A depth D-HMb of each of the grooves HMb may be smaller than the thickness D-MS of the mask sheet F-MSd. The grooves HMb may be defined in an upper surface U-MSd of the mask sheet F-MSd coupled to the unit masks UM.

Referring to FIG. 12B, the opening OP (see FIG. 5) formed in the mask sheet F-MSd may be formed by emitting laser toward a lower surface B-MSd of the mask sheet F-MSd to remove a portion of the mask sheet F-MSd. For example, the laser device LS may emit laser onto a portion overlapping the grooves HMb of the mask sheet F-MSd, thereby forming the opening OP overlapping the cell region CA of the unit mask UM.

Figure 12C:
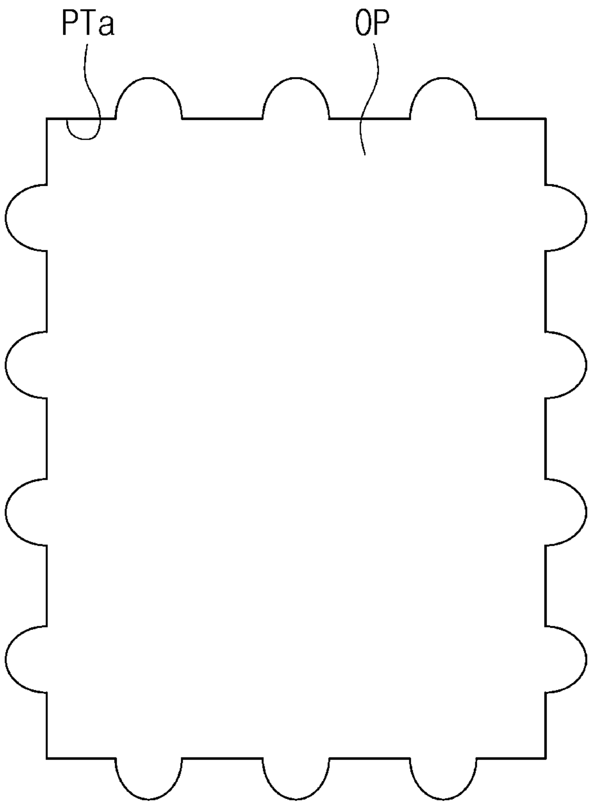
FIG. 12C is a schematic plan view illustrating a part of a mask assembly manufacturing method according to an embodiment of the disclosure.

FIG. 12C is a schematic plan view illustrating a part of the mask assembly manufacturing method according to an embodiment of the disclosure. FIG. 12C illustrates a planar shape of the opening OP (see FIG. 5) of the mask sheet F-MSd (see FIG. 12B) formed overlapping the first part P1 in FIG. 12B.

Referring to FIGS. 12B and 12C, an inner surface, defining the opening OP, of the mask sheet F-MSd may include a protrusion PTa. The protrusion PTa may be provided in plurality, and the protrusions PTa may be spaced apart from each other along the inner surface.

Since the cell region CA of the unit mask UM is coupled to overlap the grooves HMb formed by processing the preliminary mask sheet, and the opening OP is formed in a portion overlapping the cell region CA, the opening OP of the mask sheet F-MSd may include the protrusion PTa shape. The recessed groove between the protrusions PTa may be formed by the grooves HMb, and the protrusions PTa may be formed through a cutting process in which a laser device LS forms the opening OP by emitting laser.

According to an embodiment, since the opening OP of the mask sheet F-MSd is formed after the unit mask UM is coupled to the mask sheet F-MSd, a deformation force acting on the mask sheet F-MSd may be smaller than in case that the unit mask UM is coupled to the mask sheet in which the opening OP is already formed. Accordingly, since the deformation force of the mask sheet F-MSd becomes smaller, stress generated by stretching may be lower, and pixel position accuracy (PPA) may be further improved. Since a processing operation of forming the grooves HMb in the mask sheet F-MSd is performed first, the opening OP may be readily formed.

Figure 13:
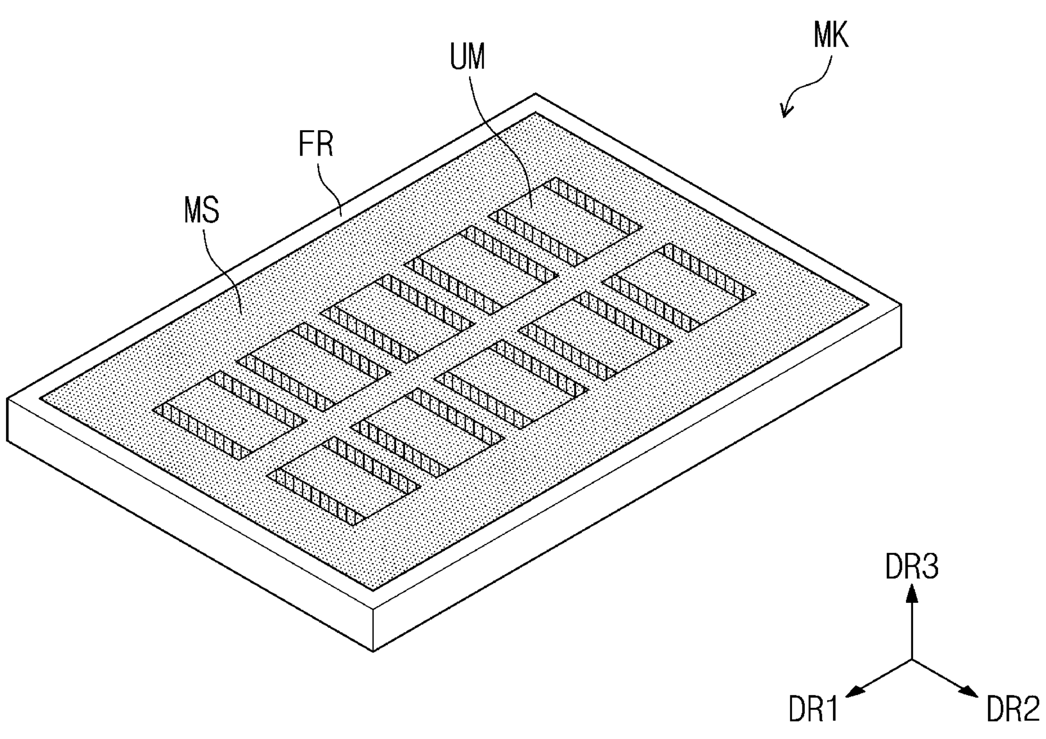
FIG. 13 is a schematic perspective view of a mask assembly according to an embodiment of the disclosure.

FIG. 13 is a schematic perspective view of a mask assembly according to an embodiment of the disclosure.

Referring to FIG. 13, the mask assembly MK may include a frame FR, a mask sheet MS, and unit masks UM.

A frame opening OP_FR (see, e.g., FIG. 1) may be defined in the frame FR. The mask sheet MS may cover the frame opening OP_FR. The mask sheet MS may be at least one of processed mask sheets F-MS, F-MSa, F-MSb, F-MSc, and F-MSd illustrated in FIGS. 8A to 12C as well as the mask sheet MS in FIG. 1. Unit masks UM may include a cell region CA in which deposition openings HP (see FIG. 4A) are defined, and a holding region HA. The unit mask UM may be stretched and coupled onto the mask sheet MS in the holding region HA using welding points. The mask sheet MS may include the first part P1 (see, e.g., FIG. 8B) and the second part P2 adjacent to the first part P1. The first part P1 may completely cover at least a portion of the deposition openings HP.

According to the above description, since an opening of a mask sheet is formed after a unit mask is coupled to the mask sheet, a deformation force acting on the mask sheet may be smaller than in case that the unit mask is coupled to the mask sheet in which the opening is already formed. Accordingly, since the deformation force of the mask sheet becomes smaller, stress generated by stretching may be lower, and pixel position accuracy (PPA) may be further improved.

In an embodiment, since an operation of processing the mask sheet is performed first, damage to the unit mask coupled onto the mask sheet may be reduced or removed. Since the mask sheet is processed beforehand, the opening may be readily formed.

According to an embodiment, since a movement distance of a laser device emitting laser decreases in case that openings spaced apart from each other in a first direction are sequentially formed, a speed of a process for manufacturing a mask assembly may increase. Since the openings are symmetrically formed, a deformation force of the mask sheet may be reduced. Accordingly, the mask assembly in which the mask sheet is less deformed may be manufactured. Adjusting an order of forming the openings may control a deformation force acting on the mask sheet, and may also control pixel position accuracy.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A mask assembly manufacturing method comprising:

preparing a mask sheet and a frame;

stretching and fixing the mask sheet to the frame;

fixing a unit mask on the mask sheet; and forming an opening by removing an overlap portion of the mask sheet overlapping the unit mask after the fixing of the unit mask on the mask sheet.

2. The mask assembly manufacturing method of claim 1, wherein the unit mask comprises:

a cell region including a plurality of deposition openings; and a holding region adjacent to the cell region, and the opening of the mask sheet overlaps the cell region.

3. The mask assembly manufacturing method of claim 2, further comprising:

forming a preliminary opening in the mask sheet overlapping the cell region, wherein a size of the preliminary opening is smaller than a size of the opening.

4. The mask assembly manufacturing method of claim 2, further comprising:

forming a groove by removing a portion of an upper surface of a first part of the mask sheet overlapping the cell region, wherein a depth of the groove is smaller than a thickness of a second part of the mask sheet adjacent to the first part.

5. The mask assembly manufacturing method of claim 4, wherein the forming of the opening comprises removing a portion of the mask sheet overlapping the groove.

6. The mask assembly manufacturing method of claim 1, further comprising:

forming a plurality of holes arranged apart from each other along an outer line of the overlap portion of the mask sheet, wherein the plurality of holes each penetrate from an upper surface of the mask sheet toward a lower surface of the mask sheet.

7. The mask assembly manufacturing method of claim 1, further comprising:

forming a plurality of grooves arranged apart from each other along an outer line of the overlap portion of the mask sheet, wherein a depth of each of the plurality of grooves each is smaller than a thickness of the mask sheet.

8. The mask assembly manufacturing method of claim 1, further comprising:

forming a groove along an outer line of the overlap portion of the mask sheet, wherein a depth of the groove is smaller than a thickness of the mask sheet.

9. The mask assembly manufacturing method of claim 8, wherein on a plane, the groove has a closed curve shape.

10. The mask assembly manufacturing method of claim 1, wherein the forming of the opening comprises forming a plurality of openings by irradiating a lower surface of the mask sheet with laser.

11. The mask assembly manufacturing method of claim 10, wherein the forming of the plurality of openings further comprises:

forming a first opening; and forming a second opening spaced apart from the first opening in a direction.

12. The mask assembly manufacturing method of claim 10, wherein the forming of the plurality of openings further comprises:

forming a first opening on an edge of the mask sheet; and forming a second opening adjacent to a central portion of the mask sheet after the forming of the first opening.

* * * * *